United States Patent
Armstrong et al.

(10) Patent No.: US 6,486,399 B1
(45) Date of Patent: Nov. 26, 2002

(54) POLE MOUNT CABINET AND METHOD FOR ASSEMBLING THE SAME

(75) Inventors: John Armstrong, Cary, NC (US); Dan Cronin, Raleigh, NC (US); Brian Lance, Knightdale, NC (US)

(73) Assignee: Powerware Corporation, Raleigh, NC (US)

( * ) Notice: Subject to any disclaimer, the term of this patent is extended or adjusted under 35 U.S.C. 154(b) by 0 days.

(21) Appl. No.: 09/851,491

(22) Filed: May 8, 2001

(51) Int. Cl.[7] ............................................... H01H 9/02
(52) U.S. Cl. ..................... 174/58; 220/4.02; 439/535; 361/730
(58) Field of Search ................. 174/48, 58, 50, 174/45 R; 220/3.8, 4.02; 439/535; 361/730; 385/134–137

(56) References Cited

U.S. PATENT DOCUMENTS

| | | | |
|---|---|---|---|
| 2,752,217 A | * | 6/1956 | Simon .................... 174/58 X |
| 3,187,084 A | * | 6/1965 | Stillman et al. ............ 174/58 |
| 5,473,115 A | * | 12/1995 | Brownlie et al. ........... 174/50 |
| 6,218,615 B1 | * | 4/2001 | Canonico .................. 174/50 |
| 6,220,726 B1 | * | 4/2001 | Gordin ................... 362/247 |
| 6,229,948 B1 | * | 5/2001 | Blee et al. ............... 385/134 |

OTHER PUBLICATIONS

Polemount CS Outdoor Enclosures, Available from World Wide Web: <http://www.enclosureinfo.com/tech/rittal/ovr/rittal/ovr/v1>, 2 pages.

Moore DP, LLC, Telecommunication Network Construction Products, Available from World Wide Web: <http://www-.moredp.com/telecommunication>, 2 pages.

Alpha Technologies, PWE Series, Available from World Wide Web: <http://www.alph . . . ain&product_id= 39&product_mar>, 1 page.

* cited by examiner

Primary Examiner—Anthony Dinkins
Assistant Examiner—Dhiru R Patel
(74) Attorney, Agent, or Firm—Myers Bigel Sibley & Sajovec (57) ABSTRACT

A pole mount cabinet for housing and supporting an article on a pole includes a housing having a rear wall and defining a chamber. The housing defines a rear opening in the rear wall. A mounting and support framework is adapted to be secured to the pole and includes at least one support member extending horizontally. The support member extends through the rear opening and into the chamber. The article can be positioned in the chamber such that it is supported by the support member.

68 Claims, 6 Drawing Sheets

POLE MOUNT CABINET AND METHOD FOR ASSEMBLING THE SAME

FIELD OF THE INVENTION

The present invention relates to cabinets and, more particularly, to pole mount cabinets.

BACKGROUND OF THE INVENTION

Pole mount cabinets are commonly used to support and house electronic equipment such as community antenna television (CATV) equipment. CATV equipment may include, for example, one or more batteries along with a power supply, which may weigh on the order of seventy-five pounds and two hundred and twenty-five pounds, respectively. The cabinet may also be subjected to structural, wind and/or ice loads. To support such large static and dynamic loads, CATV pole mount cabinets are typically formed substantially entirely of steel or aluminum. Such steel or aluminum cabinets may be costly, heavy and difficult to install on utility poles.

SUMMARY OF THE INVENTION

According to embodiments of the invention, a pole mount cabinet for housing and supporting an article on a pole includes a housing having a rear wall and defining a chamber. The housing defines a rear opening in the rear wall. A mounting and support framework is adapted to be secured to the pole and includes at least one support member extending horizontally. The support member extends through the rear opening and into the chamber. The article can be positioned in the chamber such that it is supported by the support member.

According to further embodiments of the invention, a pole mount cabinet for housing and supporting an article on a pole includes a mounting and support framework adapted to be secured to the pole and including at least one support member. A housing is mounted on the framework and defines a chamber. The article can be positioned in the chamber such that it is supported by and overlies the support member. The housing includes a first material, the framework includes a second material, and the second material has a greater yield strength and a greater modulus of elasticity than the first material.

According to embodiments of the invention, a power supply assembly adapted to be mounted on a pole includes a mounting and support framework adapted to be secured to the pole and including at least one support member. A housing is mounted on the framework and defines a chamber. A power supply is positioned in the chamber such that the power supply is supported by the support member. The housing includes a first material, the framework includes a second material, and the second material has a greater yield strength and a greater modulus of elasticity than the first material.

According to further embodiments of the invention, an enclosure adapted to be mounted on a pole using a pole mounting framework having a horizontally extending support member includes a housing defining a chamber. The housing includes a rear wall and a rear opening formed in the rear wall adapted to receive the support member.

According to the invention, a framework for supporting a housing and an article on a pole includes a load bearing, horizontally extending upper support member and a load bearing, horizontally extending lower support member. The framework further includes means for securing the framework to the pole. The framework is adapted to support the housing and the article within the housing.

According to further embodiments of the invention, a framework for supporting a housing and an article on a pole includes a pole mount bracket adapted to be secured to the pole. A support bracket is secured to the pole mount bracket and includes a platform extending forwardly from the pole mount bracket. A shelf bracket is connected to the pole mount bracket above the platform and is adapted to support the housing and the article within the housing.

According to method embodiments of the invention, a method for assembling and mounting a cabinet on a pole includes securing a framework to the pole. Thereafter, a housing is secured to the framework. The housing includes a first material and the framework includes a second material. The second material has a greater yield strength and a greater modulus of elasticity than the first material. Preferably, the first material is a polymeric material and the second material is a metallic material.

According to further method embodiments, a method for assembling and mounting a cabinet on a pole includes securing a pole mount bracket to the pole. A support bracket is secured to the pole mount bracket such that a platform of the support bracket extends forwardly from the pole mount bracket. A shelf bracket is placed on the platform. The shelf bracket includes a support member extending horizontally. The shelf bracket is secured to the pole mount bracket. A housing is mounted on the shelf bracket.

Embodiments of the pole mount cabinets, enclosures, frameworks, power supply assemblies and methods of the invention may provide lower cost alternatives to traditional sheet metal cabinets, for example, as used in the CATV industry. The polymeric housings and covers may provide lightweight, durable environmental barriers for articles such as power supplies and batteries. The frameworks may be adapted to support relatively large loads. In this manner, the load bearing frameworks may free the housing from loading requirements and associated creep, for example. Moreover, the pole mount cabinets, enclosures, frameworks, power supply assemblies and methods of the invention may allow stepwise, progressive installation so that the cabinets and power supply assemblies may be mounted and assembled with relative ease and by one person.

Objects of the present invention will be appreciated by those of ordinary skill in the art from a reading of the figures and the detailed description of exemplary embodiments which follow, such description being merely illustrative of the present invention.

BRIEF DESCRIPTION OF THE DRAWINGS

The accompanying drawings, which are incorporated in and constitute a part of the specification, illustrate embodiments of the invention and, together with the description, serve to explain principles of the invention.

DETAILED DESCRIPTION OF THE INVENTION

The present invention now will be described more fully hereinafter with reference to the accompanying drawings, in which exemplary embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
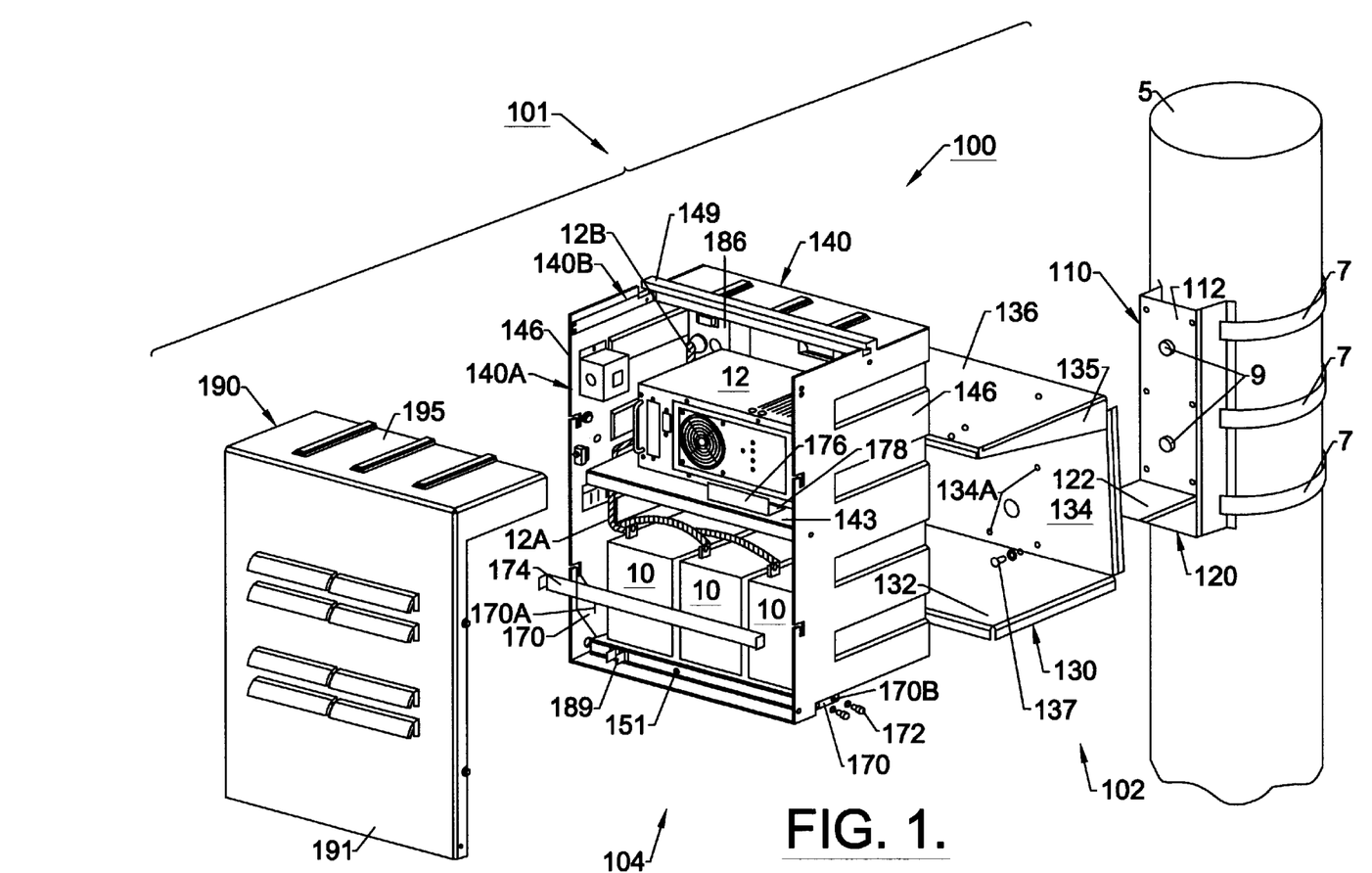
FIG. 1 is an exploded, front perspective view of a power supply assembly according to embodiments of the present invention mounted on a pole, the power supply assembly including a hybrid pole mount cabinet according to embodiments of the invention.
Figure 2:
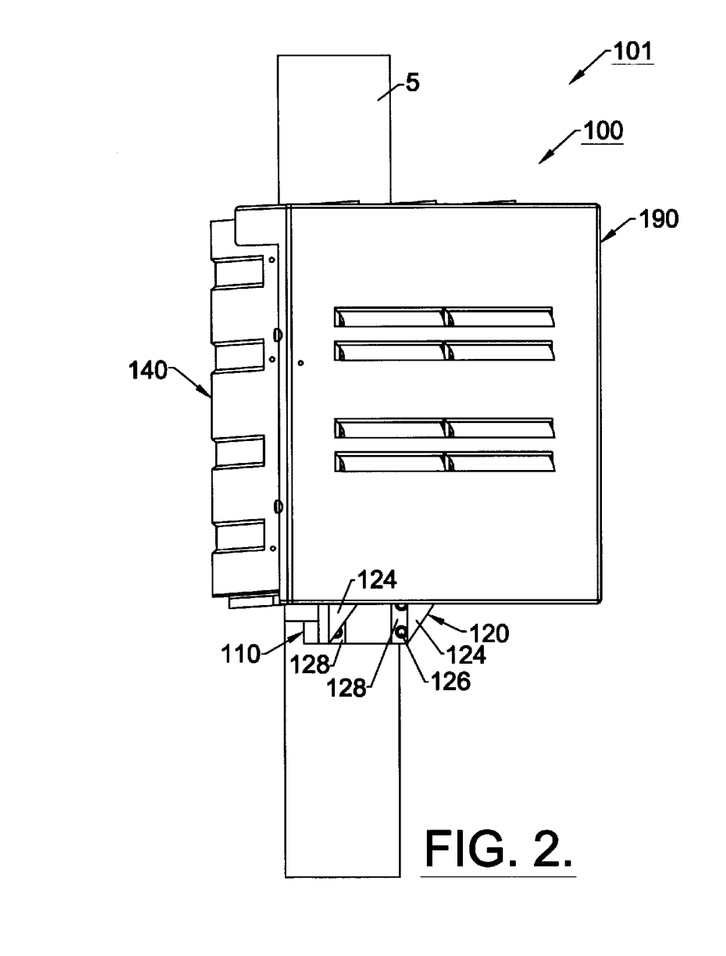
FIG. 2 is a front perspective view of the power supply assembly of FIG. 1 mounted on the pole.
Figure 3:
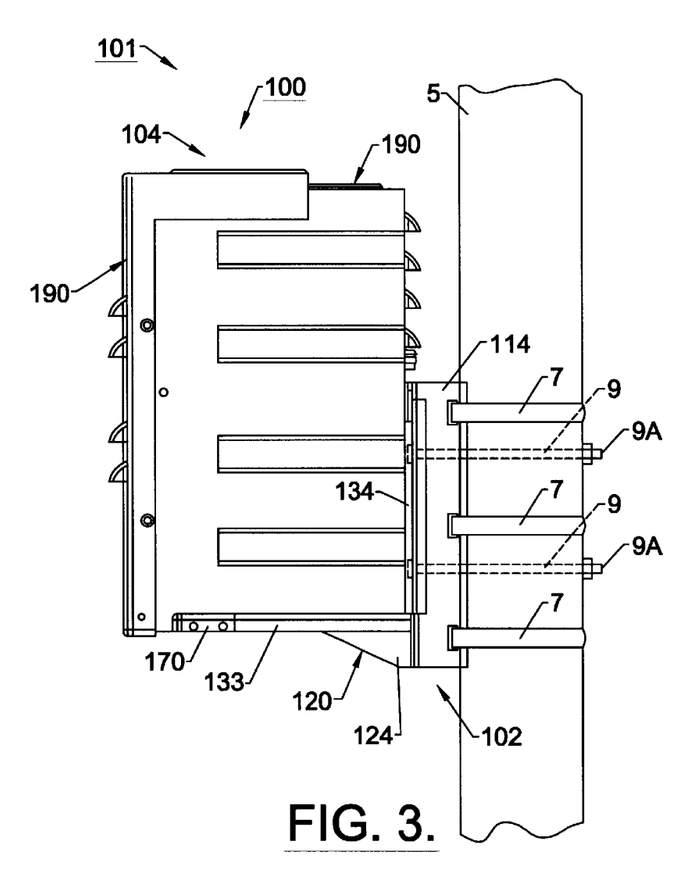
FIG. 3 is a side elevational view of the power supply assembly of FIG. 1 mounted on the pole.
Figure 4:
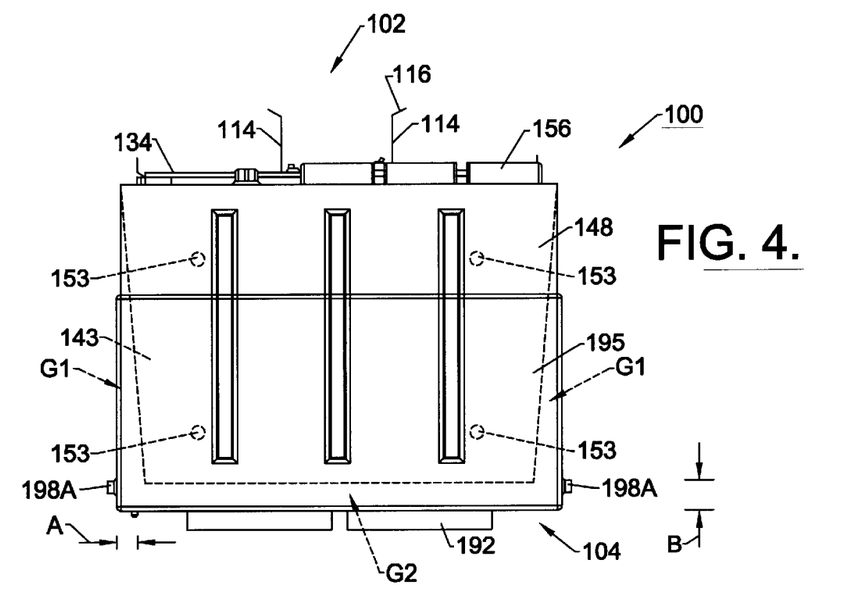
FIG. 4 is a top plan view of a hybrid pole mount cabinet forming a part of the power supply assembly of FIG. 1.
Figure 5:
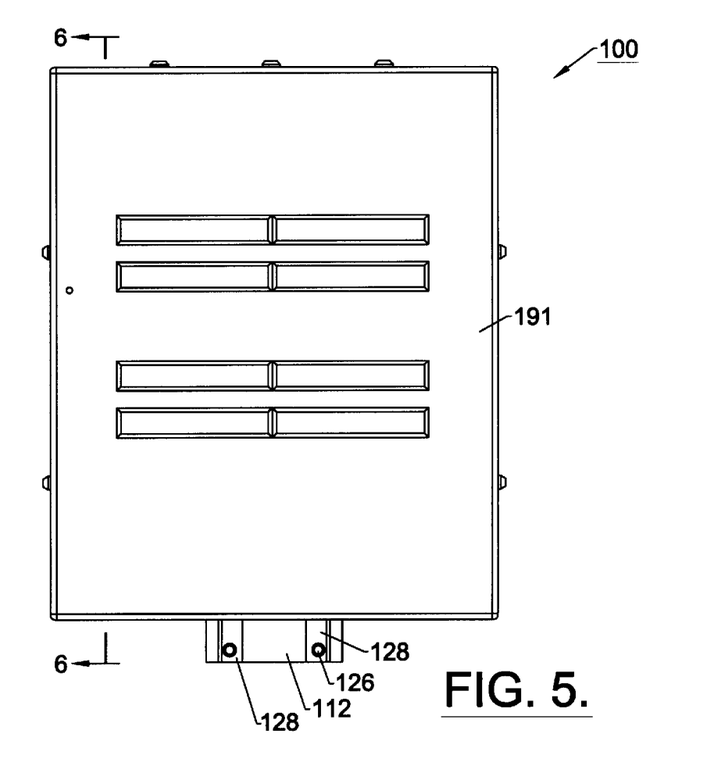
FIG. 5 is a front elevational view of the hybrid pole mount cabinet of FIG. 4.

With reference to FIGS. 1–3, a hybrid pole mount cabinet 100 according to the invention is shown therein mounted on a pole 5 (for example, a utility pole) and holding a plurality of batteries 10 and a power supply 12 (see FIG. 1). The cabinet 100, the batteries 10 and the power supply 12 form a power supply assembly 101. The cabinet 100 is also shown in FIGS. 4 and 5 without the pole 5.

The cabinet 100 includes a framework 102 and an enclosure 104. The framework 102 includes a pole mount bracket 110, a support bracket 120 and a U-shaped shelf bracket 130. The enclosure 104 includes a housing 140 and an outer cover 190. Preferably, and as discussed in more detail below, the brackets 110, 120 and 130 are formed of a metal such as steel or aluminum and the housing 140 and the cover 190 are formed of a suitable polymeric material. As will be better appreciated from the description that follows, the cabinet 100 may be used to support and protect electronic components such as the batteries 10 and the power supply 12 while also providing a cabinet having reduced cost and greater ease of installation.

Figures 10, 11, 12:
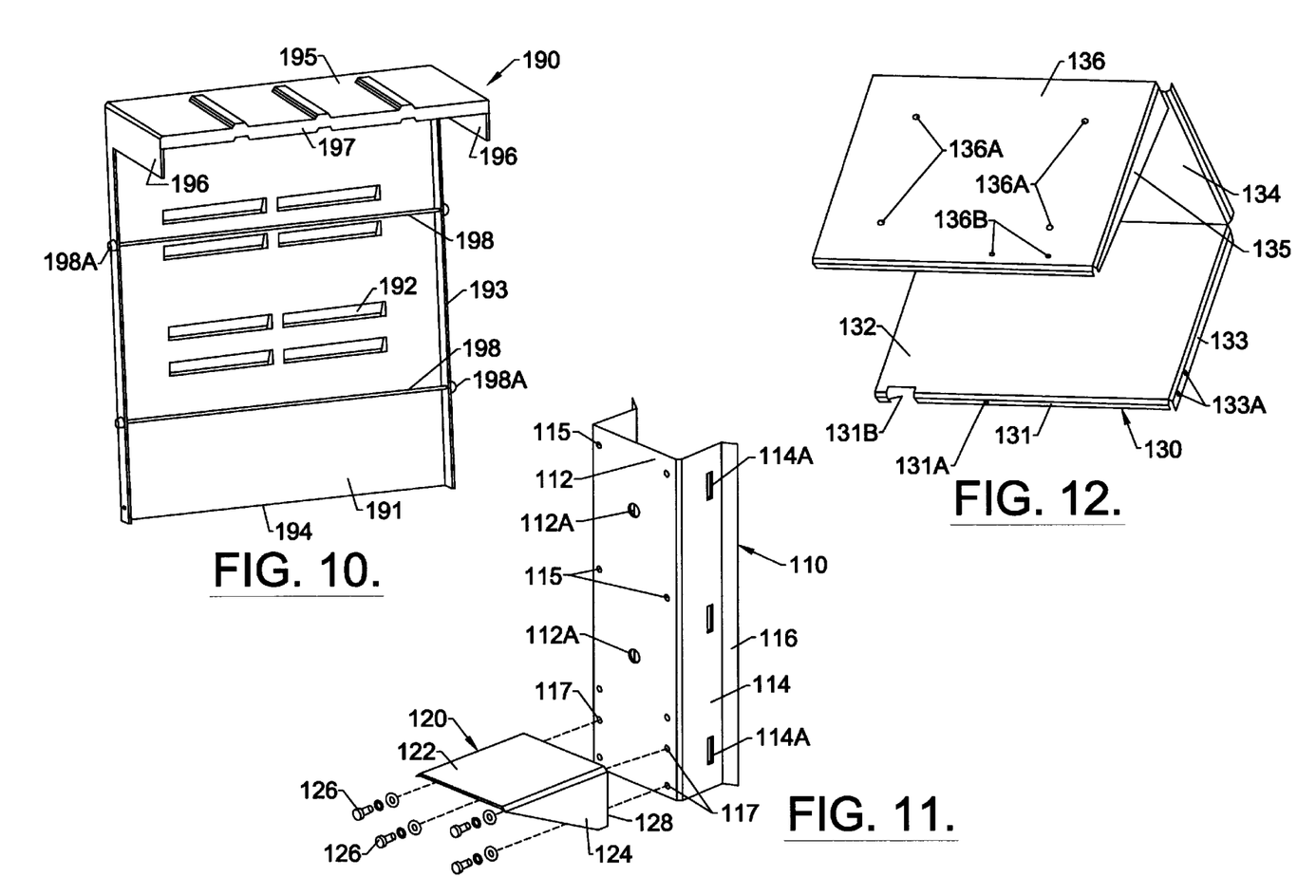
FIG. 10 is a top, rear perspective view of the front cover of the hybrid pole mount cabinet of FIG. 4.
FIG. 11 is an exploded, front perspective view of a pole mount bracket and a support bracket each forming a part of the hybrid pole mount cabinet of FIG. 4.
FIG. 12 is a top, front perspective view of a U-shaped shelf bracket forming a part of the hybrid pole mount cabinet of FIG. 4.

With reference to FIG. 11, the pole mount bracket 110 is a generally U-shaped channel bracket having a front wall 112, a pair of rearwardly extending side walls 114 and further rearwardly extending, outwardly flared flanges 116. Slots 114A are formed in the side walls 114 to receive straps 7 for securing the bracket 110 to the pole 5 as shown in FIGS. 1–3. Alternatively, or additionally, the bracket 110 may be secured to the pole 5 by inserting bolts 9 through holes 112A in the front wall 112 and securing the bolts to the pole 5 using nuts 9A (FIG. 3). A series of holes 115 and a series of holes 117 are also formed in the front wall 112.

With reference to FIGS. 2 and 11, the support bracket 120 includes an upper platform wall 122, side walls 124, and rear attachment flanges 128 extending from the side walls 124 (as best seen in FIG. 2). The support bracket 120 is adapted to be secured to the front wall 112 of the bracket 110 by inserting screws 126 through holes in the flanges 128 and through the holes 117. In alternative embodiments (not shown), the support bracket may be integrally formed with the pole mount bracket, for example, by stamping a unitary sheet of metal or welding.

With reference to FIGS. 1 and 12, the shelf bracket 130 includes a lower support shelf or shelf wall 132, an upper support shelf or shelf wall 136 and a rear wall 134 extending between the shelf walls 132 and 136. Opposed side walls 133 depend from the shelf wall 132 and have holes 133A formed therein. A front wall 131 also depends from the shelf wall 132 and has a hole 131A and a slot 131B formed therein. Opposed side walls 135 depend from the upper shelf wall 136. Holes 136A and 136B are formed in the shelf wall 136.

Figure 7:
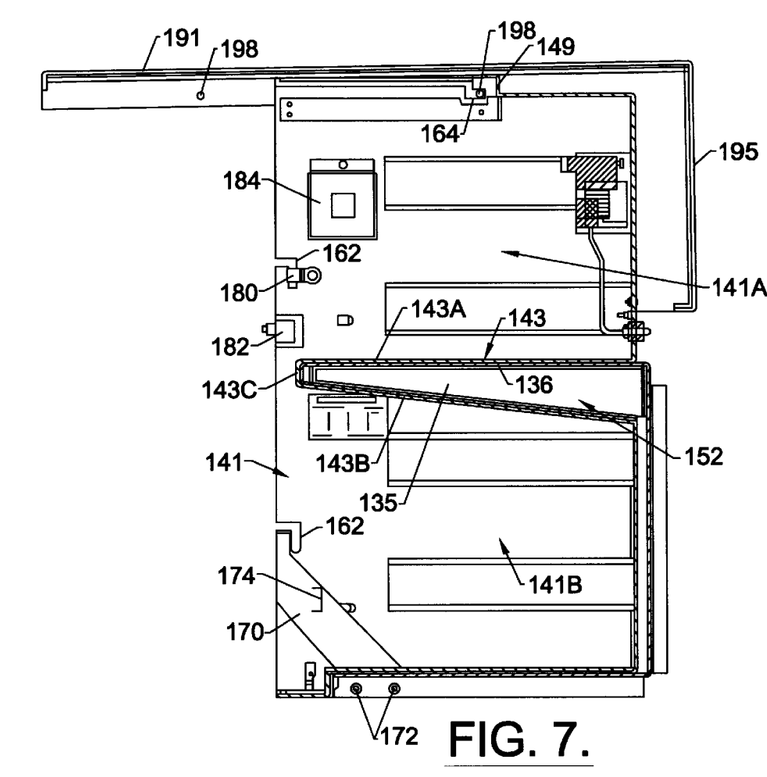
FIG. 7 is a cross-sectional view of the hybrid pole mount cabinet of FIG. 4 taken along the same section as the view of FIG. 6, wherein the front cover is in a maintenance position.
Figure 8:
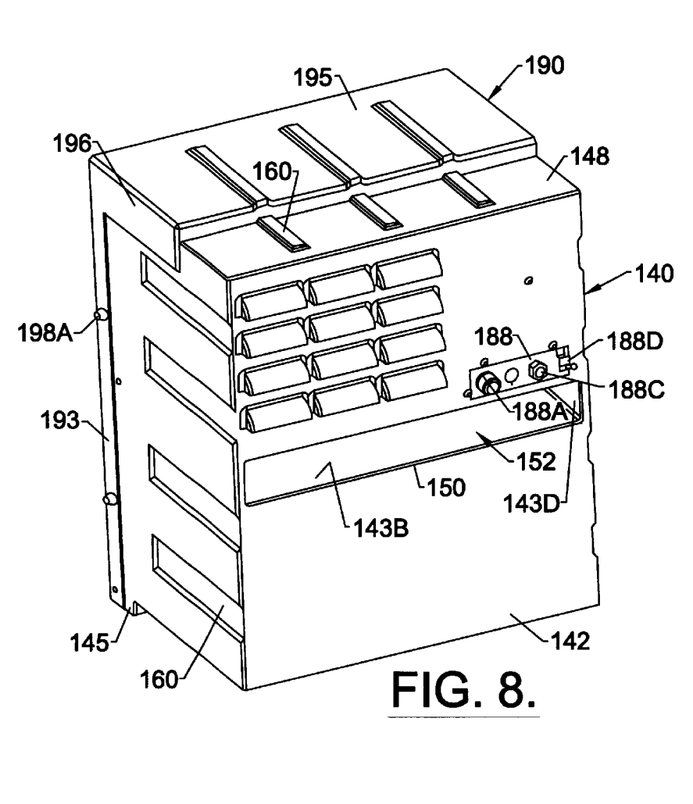
FIG. 8 is a top, rear perspective view of the front cover and a housing forming a part of the hybrid pole mount cabinet of FIG. 4.
Figure 9:
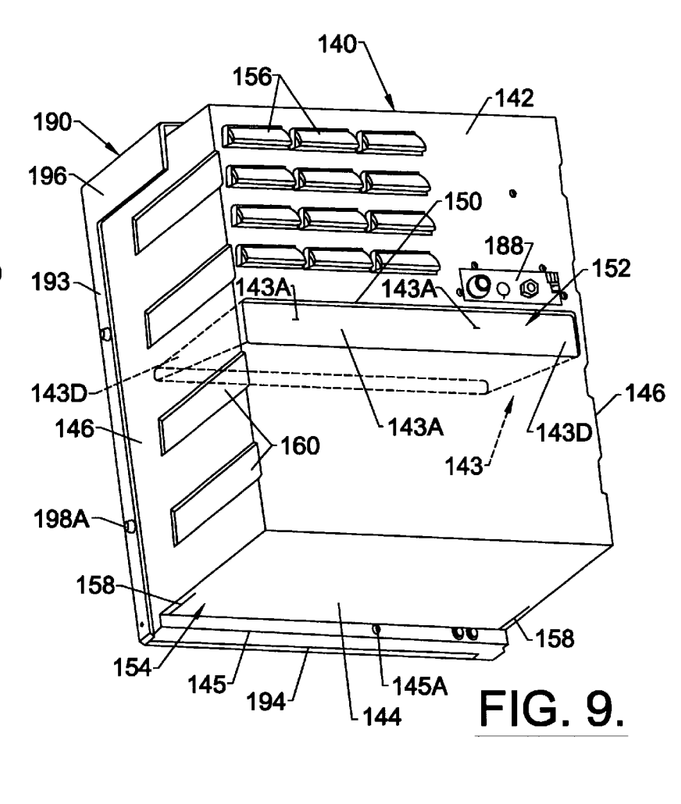
FIG. 9 is a bottom, rear perspective view of the front cover and the housing of the hybrid pole mount cabinet of FIG. 4.

With reference to FIGS. 8 and 9, the housing 140 includes a rear wall 142, a bottom wall 144, a front flange 145 (depending from the bottom wall 144), opposed side walls 146 and a top wall 148. A top flange 149 extends upwardly from the top wall 148. As shown in FIG. 1, the housing 140 includes a shelf 143 extending between the side walls 146. The shelf 143 includes a horizontal top wall 143A (FIG. 7), a downwardly sloped (front to rear) bottom wall 143B (FIG. 7), a vertical front wall 143C (FIG. 7) and opposed, vertical side walls 143D (FIG. 9). Preferably, and as shown, the shelf 143 is attached to, and more preferably integrally molded with, the rear wall 142. As best seen in FIG. 4, the shelf 143 is forwardly tapered to define gaps G1 between the shelf 143 and the adjacent side walls 146. Preferably, the gaps G1 each have a maximum width A of between about 0.75 and 1.0 inch. The housing 140 defines an opening including a top opening portion 140B and a front opening portion 140A (FIG. 1). The housing 140 further defines an interior chamber 141 including an upper subchamber 141A and a lower subchamber 141B separated by the shelf 143 (see FIG. 7). The front edge of the shelf 143 is spaced rearwardly from the opening 140A to define a gap G2 (FIG. 4), preferably having a width B of between about 1.25 and 1.75 inches.

As best seen in FIGS. 6–9, an opening 150 is defined in the rear wall 142 and communicates with a pocket 152 (see FIG. 9) defined in the shelf 143. The pocket 152 is defined by the top wall 143A, the bottom wall 143B, the front wall 143C and the side walls 143D. Preferably, the pocket 152 is fully enclosed except for the opening 150 and the mounting holes in the top wall 143A. The front flange 145 and the bottom wall 144 define a lower recess 154 that opens downwardly and rearwardly.

Venting louvers 156 extend from the rear wall 142 and communicate with the upper chamber 141A. The louvers 156 may be backed with screening to prevent entry of birds, insects and the like. Slots 158 are formed in the bottom wall 144 and communicate with the lower subchamber 141B. L-shaped slots 162 and 164 are formed in the side walls 146. A mounting hole 145A is formed in the flange 145. Mounting holes 143A are formed in the top wall of the shelf 143.

Figure 6:
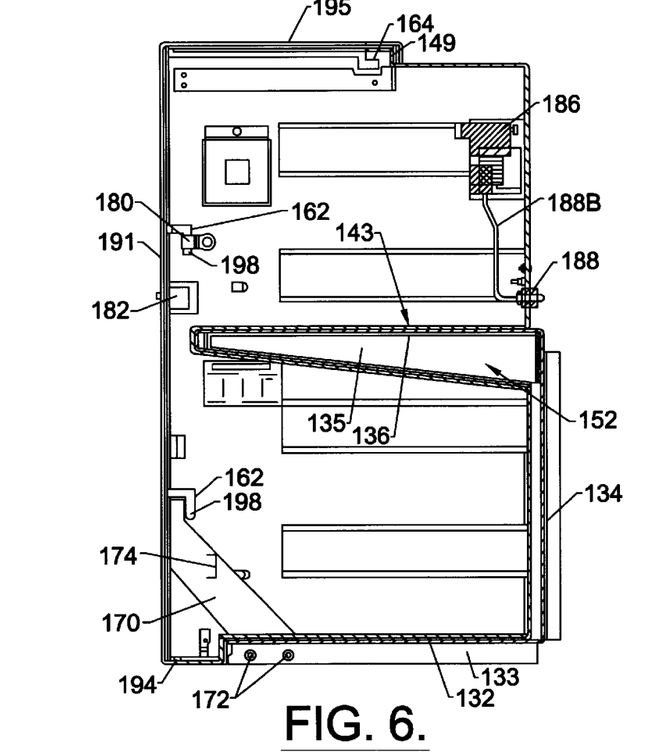
FIG. 6 is a cross-sectional view of the hybrid pole mount cabinet of FIG. 4 taken along the line 6—6 of FIG. 5, wherein a front cover of the hybrid pole mount cabinet is in a closed position.

A lockable latch 180 (FIG. 7) is operably mounted adjacent one of the slots 162. A tamper detection/alarm switch 182 is operably mounted adjacent the front opening 140A of the housing 140. A bypass switch 184, a duplex receptacle 186, and a connector assembly 188 are secured to the housing 140 by suitable fasteners (FIGS. 6–8). The connector assembly 188 includes an input connector 188A, an output connector 188C and a ground connector 188D. The receptacle 186 may include a circuit breaker. The bypass switch 184 is adapted to receive a connector from an alternative backup power supply and is connected to the output connector 188C by suitable wiring (not shown). LED's (which may be connected to the batteries 10 via the power supply 12 to indicate, for example, a low battery voltage condition) are mounted in the flange 145 and extend into the slot 131B.

Opposing side plate brackets 170 (FIGS. 1, 6 and 7) extend through respective ones of the slots 158 and each include a slot 170A and a pair of mounting holes 170B formed therein. A cross-brace 174 is adapted to be mounted in the slots 170A as discussed below. An L-shaped retention bracket 176 is also provided and adapted to be mounted on the shelf 143 as discussed below.

With reference to FIG. 10, the cover 190 includes a front wall 191 having venting louvers 192 formed therein. The louvers 192 may be backed with screening to prevent entry of birds, insects and the like. Opposed side walls 193, a lower lip 194 and a top wall 195 extend rearwardly from the front wall 191. Opposed side walls 196 and an upper lip 197 each depend from the top wall 195. A pair of mounting rods 198 extend transversely across the front wall 191 and through the side walls 193 and are secured in place by end caps 198A.

The brackets 110, 120, 130 are preferably formed of a strong, rigid metal of a selected thickness sufficient to support the batteries 10 and the power supply 12 for at least ten years. Preferably, the material has a yield strength of at least 28,000 psi, and more preferably of between about 30,000 and 50,000 psi. Preferably, the material has a modulus of elasticity of at least 10,000 ksi, and more preferably of between about 11,000 and 30,000 ksi. The walls of the brackets 110, 120, 130 preferably have a thickness of between about 0.120 and 0.250 inch. Suitable materials include steel and aluminum. Alternatively, the brackets 110, 120, 130 may be formed of other strong, rigid materials such as a ceramic. Each of the brackets 110, 120, 130 is preferably integrally formed. More preferably, each of the respective brackets is formed by stamping.

One or both of the housing 140 and the cover 190 may be formed of a less strong, less rigid material than the material or materials used for the brackets 110, 120, 130. Preferably, the material of the housing 140 and the cover 190 is lighter weight than the material used to form the brackets 110, 120, 130. Preferably, both the housing 140 and the cover 190 are formed of a polymeric material. Suitable materials include polyethylene, polyurethane, polypropylene and polycarbonate. Preferably, the housing 140 and the cover 190 are each integrally molded and may be rotation molded.

Preferably, the material of the housing 140 and the cover 190 has a UV rating of at least UV-8. Preferably, the material has an impact resistance of at least 52 as measured using an Association of Rotomolders (ARM) impact test at −40° C. with a 1/8 inch specimen. The material should meet or exceed the wind, ice loading and flammability requirements of *Underwriters Laboratories (UL) Standard for Safety for Enclosures for Electrical Equipment,* UL50, 11th Edition, October 1995. Preferably, the material has a melting point of at least 260° F. and a deflection temperature at 0.46 MPa per ASTM D648, 1st Edition, August 2001, of at least 126° F.

Preferably, the density of the material is no greater than 1.00 grams per cubic centimeter.

Preferably, the cabinet 100 is adapted to support a load of at least 20 pounds, more preferably of at least 100 pounds, and most preferably of at least 300 pounds. Preferably, the upper shelf wall 136 is adapted to support a load of between about 20 and 90 pounds. Preferably, the lower shelf wall 132 is adapted to support a load of between about 100 and 250 pounds.

The power supply 12 may be any suitable power supply such as an uninterruptible power supply (UPS). Suitable power supplies include UPS Product No. CPR or Product No. ZTT/Plus each available from Powerware Corporation of Raleigh, N.C. The batteries may be any suitable batteries such as lead-tin batteries. Suitable batteries include battery Product No. CPR-40 or CPR-70 available from Powerware Corporation.

The construction of the cabinet 100 and the power supply assembly 101 may be more fully appreciated from the description of exemplary methods of assembly as set forth below.

The cabinet 100 may be mounted and assembled in the following manner. The pole mount bracket 110 is secured to the pole 5 by means of the straps 7 and/or the bolts 9 and the nuts 9A. Before or after the pole mount bracket 110 is mounted on the pole 5, the support bracket 120 is secured to the bracket 110 using fasteners 126. The shelf bracket 130 may then be perched on the support bracket 120 (i.e., with the lower surface of the lower shelf wall 132 engaging the platform wall 122). The shelf bracket 130 is then secured to the pole mount bracket 110 by inserting the fasteners 137 through the mounting holes 134A in the bracket 130 and the mounting holes 113 in the pole mount bracket 110. In this manner, the support bracket 120 serves as a temporary support for the shelf bracket 130 while the shelf bracket 130 is being secured to the pole mount bracket 110, thereby facilitating installation.

The housing 140 is then mounted on the shelf bracket 130. More particularly, the housing 140 is pushed onto the bracket 130 such that the upper shelf wall 136 slides into the pocket 152 of the shelf 143 and the lower shelf wall 132 slides into the recess 154. The housing 140 is secured in place by inserting a fastener 151 (FIG. 1) through the hole 145A (FIG. 9) and the hole 131A (FIG. 12). The housing 140 is also secured in place by inserting fasteners 153 (FIG. 4) through the holes 143A (FIG. 9) and the holes 136A (FIG. 12).

The retention bracket 176 is installed by inserting the fasteners 178 through holes (not shown) in the shelf 143 and into the holes 136B (FIG. 12) in the shelf bracket 130, thereby further securing the housing 140. The side brackets 170 are installed in the slots 158. The fasteners 172 are inserted through the holes 170B (FIG. 1) and the holes 133A (FIG. 12).

The batteries 10 may thereafter be placed on the bottom wall 144. The crossbrace 174 is inserted downwardly into the slots 170A of each bracket 170 to hold the batteries 10 in place. The power supply 12 may be placed on the shelf 143. Notably, the loads of the batteries 10 and the power supply 12 are supported by the lower shelf wall 132 and the upper shelf wall 136, respectively.

An AC input line (e.g., a 120 volt utility line from a transformer; not shown) is connected to the connector 188A (FIG. 8). The connector 188A is electrically connected to the receptacle 186 by wiring 188B (FIG. 6), which is preferably pre-installed. The power supply 12 is electrically connected to the receptacle 186 by a cord 12B (FIG. 1). The power supply 12 is also connected to the batteries 10 and the LED's 189 by a wiring harness 12A (FIG. 1) that extends down through one of the gaps G1 between the shelf 143 and an adjacent side wall 146. The power supply 12 is further electrically connected to the connector 188C (FIG. 8) and the ground connector 188D by suitable wiring (not shown). An output cable such as a CATV coaxial cable (not shown) may be connected to the connector 188C. This coaxial cable may be connected for power delivery to one or more amplifiers or the like of a CATV distribution system. In this manner, the power supply 12 and the batteries 10 are installed to supply the CATV output connector 188C with power from the AC input line at the connector 188A as well as a backup power supply from the batteries 10.

The cover 190 may thereafter be installed by inserting the rods 196 inwardly and downwardly into the L-shaped slots 162 to attain the closed position as shown in FIG. 6. The latch 180 may be used to lock the front cover 190 in place. When the operator desires to access the chamber 141, for example, to remove, install and/or maintain the batteries 10 or the power supply 12, the front cover 190 may be removed or otherwise repositioned to an open position. Optionally, the front cover 190 may be reinstalled in the maintenance position as shown in FIG. 7 using the slots 164. Notably, the front cover 190 provides a rain and sun shield for the operator when in the maintenance position. The tamper switch 182 may serve to provide a signal locally (e.g., using a sound transducer or light) and/or remotely (e.g., using a transponder) when the cover 190 is displaced away from the opening 140A.

The hybrid pole mount cabinet 100 may provide a lower cost alternative to traditional sheet metal cabinets, for example, as used in the CATV industry. The polymeric housing 140 and cover 190 may provide a lightweight, durable environmental barrier for the power supply 12 and the batteries 10. The brackets 110, 120, 130 form a structural framework that may be adapted to support the relatively large loads of the power supply and batteries. In this manner, the brackets 110, 120, 130 serve as a load bearing framework that frees the polymeric housing 140 from loading requirements and associated creep. Preferably, the shelf 143 is non-load bearing in the assembled cabinet 100. Moreover, the cabinet 100 and method of assembly of the invention allow stepwise, progressive installation so that the power supply assembly 101 may be mounted and assembled by one person and with relative ease.

Means for fastening other than those described herein may be used to secure the various components of the cabinet 100 to one another. For example, clamps, grommets, ties, welds and other suitable mechanical connecting devices and structures may be used.

While in the preferred embodiments the upper and lower support members are planar shelf walls 132, 135, support members of other configurations may be used. The support members may each include a lattice, grate, and/or two or more forwardly extending prongs, for example. Similarly, the rear wall 134 may be replaced with connecting members of other constructions and configurations extending vertically between the upper and lower support members.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A pole mount cabinet for housing and supporting an article on a pole, said cabinet comprising:
   a) a housing having a rear wall and defining a chamber, said housing defining a rear opening in said rear wall; and
   b) a mounting and support framework adapted to be secured to the pole and including at least one support member extending horizontally, said support member extending through said rear opening and into said chamber;
   c) wherein the article can be positioned in said chamber such that it is supported by said support member.

2. The cabinet of claim 1 wherein said housing is formed of a lighter weight material than said framework.

3. The cabinet of claim 1 wherein said housing includes a first material, said framework includes a second material and said second material has a greater yield strength and a greater modulus of elasticity than said first material.

4. The cabinet of claim 3 wherein said first material is a polymeric material and said second material is a metallic material.

5. The cabinet of claim 3 wherein said second material has a yield strength of at least 28,000 psi and a modulus of elasticity of at least 10,000 ksi.

6. The cabinet of claim 1 wherein said support member provides a horizontally extending shelf.

7. The cabinet of claim 1 wherein said framework includes a second support member extending horizontally and positioned to support an article in said chamber.

8. The cabinet of claim 7 wherein:
   said housing includes a bottom wall; and
   said second support member is positioned adjacent said bottom wall.

9. The cabinet of claim 8 wherein:
   said housing includes a front flange;
   said front flange and said bottom wall define a lower recess; and
   said second support member is disposed in said lower recess.

10. The cabinet of claim 7 wherein said framework includes a shelf bracket that comprises said first and said second support members and a vertically extending connecting member extending between said first and second support members.

11. The cabinet of claim 1 wherein said framework includes:
    a pole mount bracket adapted to be secured to the pole to support said cabinet; and
    a platform extending forwardly from said pole mount bracket and disposed below said support member.

12. The cabinet of claim 11 wherein said framework includes a support bracket secured to said pole mount bracket by at least one fastener, wherein said platform forms a part of said support bracket.

13. The cabinet of claim 11 wherein said framework further includes a shelf bracket connected to said pole mount bracket and adapted to support said housing and the article, said support member forming a part of said shelf bracket.

14. The cabinet of claim 11 wherein said shelf bracket includes a second support member extending horizontally and disposed below said first mentioned support member and a connecting member extending between said first mentioned support member and said second support member.

15. The cabinet of claim 1 wherein:
said housing includes a housing shelf disposed in said chamber and an interior pocket defined within said housing shelf and communicating with said rear opening; and
said support member is disposed in said pocket.

16. The cabinet of claim 15 wherein said housing shelf is non-load bearing.

17. The cabinet of claim 1 including a cover secured to said housing, wherein said cover is selectively positionable between a closed position wherein said cover restricts access to said chamber and an open position wherein said cover allows access to said chamber.

18. The cabinet of claim 17 wherein said cover is formed of a polymeric material.

19. The cabinet of claim 17 wherein at least a portion of said cover extends forwardly from an upper end of said housing when said cover is in said open position.

20. The cabinet of claim 17 wherein said cover includes a front wall and a top wall extending rearwardly from said front wall and overlying said chamber.

21. The cabinet of claim 1 including a retention member removably connected to said framework and extending across said chamber to retain the article on said support member.

22. The cabinet of claim 1 adapted to support a load of at least 100 pounds, wherein said framework is constructed to be load bearing and said housing is constructed to not be load bearing.

23. The cabinet of claim 22 wherein said framework further includes a second support member extending horizontally and positioned below said first mentioned support member and under a bottom wall of said housing, and wherein said housing includes a pocket providing said rear opening into which said first mentioned support member extends.

24. A pole mount cabinet for housing and supporting an article on a pole, said cabinet comprising:
a) a mounting and support framework adapted to be secured to the pole and including at least one support member; and
b) a housing mounted on said framework and defining a chamber, wherein the article can be positioned in said chamber such that it is supported by and overlies said support member;
c) wherein said housing includes a first material, said framework includes a second material and said second material has a greater yield strength and a greater modulus of elasticity than said first material.

25. The cabinet of claim 24 wherein said first material is lighter weight than said second material.

26. The cabinet of claim 24 wherein said first material is a polymeric material and said second material is a metallic material.

27. The cabinet of claim 26 wherein said first material is selected from the group consisting of polyethylene, polyurethane, polypropylene and polycarbonate.

28. The cabinet of claim 24 wherein said second material is selected from the group consisting of steel, galvaneal, aluminum and aluminum alloy.

29. The cabinet of claim 24 wherein said second material has a yield strength of at least 28,000 psi and a modulus of elasticity of at least 10,000 ksi.

30. The cabinet of claim 24 wherein said first material has an ultraviolet rating of at least UV-8.

31. The cabinet of claim 24 wherein said first material has an impact resistance of at least 52 as measured using an Association of Rotomolders (ARM) impact test at −40° C. with a ⅛ inch specimen.

32. The cabinet of claim 24 wherein said first material meets or exceeds the wind, ice loading and flammability requirements of UL Standard for Safety for Enclosures for Electrical Equipment, UL50, 11$^{th}$ Edition, October 1995.

33. The cabinet of claim 24 wherein said first material has a melting point of at least 260° F. and a deflection temperature at 0.46 MPa per ASTM D648, 1$^{st}$ Edition, August 2001, of at least 126° F.

34. The cabinet of claim 24 wherein said first material has a density of no greater than 1.00 g/cc.

35. A power supply assembly adapted to be mounted on a pole, said power supply assembly comprising:
a) a mounting and support framework adapted to be secured to the pole and including at least one support member;
b) a housing mounted on said framework and defining a chamber; and
c) a power supply positioned in said chamber such that said power supply is supported by said support member;
d) wherein said housing includes a first material, said framework includes a second material and said second material has a greater yield strength and a greater modulus of elasticity than said first material.

36. The power supply assembly of claim 35 wherein said first material is a polymeric material and said second material is a metallic material.

37. The power supply assembly of claim 35 wherein said second material has a yield strength of at least 28,000 psi and a modulus of elasticity of at least 10,000 ksi.

38. The power supply assembly of claim 35 wherein:
said framework includes a shelf bracket including a second horizontally extending support member disposed below said first support member and a rear wall extending between said first and second support members;
said power supply is mounted to be supported by one of said first and second support members; and
said power supply assembly further includes at least one battery mounted to be supported by the other of said first and second support members.

39. The power supply assembly of claim 35 including:
a first connector electrically connected to said power supply and adapted to engage an input AC power supply line; and
a second connector electrically connected to said power supply and adapted to engage a community antenna television (CATV) AC power output line.

40. An enclosure adapted to be mounted on a pole using a pole mounting framework having a horizontally extending support member, said enclosure comprising a housing defining a chamber and including:
a) a rear wall;

b) a housing shelf disposed in said chamber; and c) a rear opening formed in said rear wall adapted to receive the support member;

d) wherein said housing includes an interior pocket defined within said housing shelf and communicating with said rear opening, said pocket adapted to receive the support member such that a load on said housing shelf is borne by the support member.

41. The enclosure of claim 40 wherein said housing is formed of a polymeric material.

42. The enclosure of claim 40 wherein said housing includes a bottom wall and a front flange and said front flange and said bottom wall define a lower recess adapted to receive a second horizontally extending support member of the framework.

43. The enclosure of claim 40 including a cover secured to said housing, wherein said cover is selectively positionable between a closed position, wherein said cover restricts access to said chamber, and an open position, wherein said cover allows access to said chamber.

44. The enclosure of claim 43 wherein said cover is formed of a polymeric material.

45. The enclosure of claim 43 wherein at least a portion of said cover extends forwardly from an upper end of said housing when said cover is in said open position.

46. The enclosure of claim 43 wherein said cover includes a front wall and a top wall extending rearwardly from said front wall and overlying said chamber.

47. A framework for supporting a housing and an article on a pole, said framework comprising:

a) a load bearing, horizontally extending upper support member;

b) a load bearing, horizontally extending lower support member; and c) means for securing said framework to the pole, said means for securing said framework to the pole including a pole mount bracket adapted to be secured to the pole;

d) wherein said framework is adapted to support the housing and the article within the housing;

e) wherein said means for securing said framework to the pole includes a platform extending forwardly from said pole mount bracket and disposed below said support member.

48. The framework of claim 47 wherein said means for securing said framework to the pole includes a support bracket secured to said pole bracket, wherein said platform forms a part of said support bracket.

49. The framework of claim 48 wherein said framework further includes a shelf bracket connected to said pole mount bracket and adapted to support the housing and the article, said shelf bracket including said upper and lower support members.

50. A framework for supporting a housing and an article on a pole, said framework comprising:

a) a pole mount bracket adapted to be secured to the pole;

b) a support bracket secured to said pole mount bracket and including a platform extending forwardly from said pole mount bracket; and c) a shelf bracket connected to said pole mount bracket above said platform and adapted to support the housing and the article within the housing.

51. The framework of claim 50 wherein said framework is formed of a metallic material.

52. The framework of claim 50 wherein said pole mount bracket includes a first opening adapted to receive a strap for securing said framework to the pole and a second opening adapted to receive a bolt for securing said framework to the pole.

53. The framework of claim 50 wherein said shelf bracket includes an upper horizontally extending support member, a lower horizontally extending support member and a connecting member extending between said upper and lower support members.

54. The framework of claim 53 wherein one of said upper and lower support members is adapted to support at least 20 pounds and the other of said upper and lower support members is adapted to support at least 100 pounds.

55. The framework of claim 50 adapted to support a load of at least 100 pounds.

56. The framework of claim 50 wherein said pole mount bracket, said support bracket and said shelf bracket are each formed of a material having a yield strength of at least 28,000 psi and a modulus of elasticity of at least 10,000 ksi.

57. A method for assembling and mounting a cabinet on a pole, said method comprising:

a) securing a framework to the pole; and thereafter b) securing a housing to the framework;

c) wherein the housing includes a first material, the framework includes a second material and the second material has a greater yield strength and a greater modulus of elasticity than the first material.

58. The method of claim 57 wherein the first material is a polymeric material and the second material is a metallic material.

59. The method of claim 57 wherein the framework is constructed and arranged to support a load of at least 20 pounds within the housing.

60. The method of claim 59 wherein the load includes at least one of a battery and a power supply, and wherein the method further includes mounting the load in a chamber of the housing following said step of securing the housing to the framework.

61. The method of claim 60 including electrically connecting each of an input AC power supply line and a community antenna television (CATV) AC power output line to the power supply.

62. A method for assembling and mounting a cabinet on a pole, said method comprising:

a) securing a pole mount bracket to the pole;

b) securing a support bracket to the pole mount bracket such that a platform of the support bracket extends forwardly from the pole mount bracket;

c) placing a shelf bracket on the platform, the shelf bracket including a support member extending horizontally;

d) securing the shelf bracket to the pole mount bracket; and e) mounting a housing on the shelf bracket.

63. The method of claim 62 wherein steps a) and b) precede steps c), d) and e).

64. The method of claim 62 wherein said step of mounting a housing on the shelf bracket includes inserting the support member through an opening in the housing.

65. The method of claim 64 wherein said step of mounting a housing on the shelf bracket includes inserting the support member into a pocket provided in the housing.

66. The method of claim 65 wherein the pocket is defined in a shelf of the housing.

67. The method of claim 62 wherein the housing includes a first material, the framework includes a second material and the second material has a greater yield strength and a greater modulus of elasticity than the first material.

68. The method of claim 67 wherein the first material is a polymeric material and the second material is a metallic material.

* * * * *